(12) United States Patent
Yang et al.

(10) Patent No.: US 8,580,682 B2
(45) Date of Patent: Nov. 12, 2013

(54) COST-EFFECTIVE TSV FORMATION

(75) Inventors: Ku-Feng Yang, Dali (TW); Yung-Chi Lin, Su-Lin (TW); Hung-Pin Chang, Taipei (TW); Tsang-Jiuh Wu, Hsin-Chu (TW); Wen-Chih Chiou, Miaoli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 35 days.

(21) Appl. No.: 12/895,296

(22) Filed: Sep. 30, 2010

(65) Prior Publication Data

US 2012/0083116 A1    Apr. 5, 2012

(51) Int. Cl.
*H01L 21/768* (2006.01)

(52) U.S. Cl.
USPC ............. 438/667; 257/737; 257/E23.067; 257/E23.068; 257/E23.141; 257/E23.169; 438/653; 438/666; 438/668; 174/266; 361/748

(58) Field of Classification Search
USPC ........... 257/737, E23.067, E23.068, E23.141, 257/E23.169; 438/653, 666, 667, 668; 174/266; 361/748
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,004,619 A * | 12/1999 | Dippon et al. ............ 29/852 |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |

(Continued)

*Primary Examiner* — Peniel M Gumedzoe
(74) *Attorney, Agent, or Firm* — Slater & Matsil, L.L.P.

(57) ABSTRACT

A device includes a substrate having a first surface, and a second surface opposite the first surface. A through-substrate via (TSV) extends from the first surface to the second surface of the substrate. A dielectric layer is disposed over the substrate. A metal pad is disposed in the dielectric layer and physically contacting the TSV, wherein the metal pad and the TSV are formed of a same material, and wherein no layer formed of a material different from the same material is between and spacing the TSV and the metal pad apart from each other.

18 Claims, 8 Drawing Sheets

(56) References Cited

U.S. PATENT DOCUMENTS

| | | |
|---|---|---|
| 7,297,574 B2 | 11/2007 | Thomas et al. |
| 7,335,972 B2 | 2/2008 | Chanchani |
| 7,355,273 B2 | 4/2008 | Jackson et al. |
| 2006/0216921 A1* | 9/2006 | Kato .............................. 438/618 |
| 2007/0018320 A1* | 1/2007 | Tanida et al. ................. 257/737 |
| 2007/0178694 A1* | 8/2007 | Hiatt .............................. 438/667 |
| 2009/0130846 A1* | 5/2009 | Mistuhashi .................... 438/667 |
| 2009/0206488 A1* | 8/2009 | Lindgren et al. .............. 257/774 |
| 2009/0278237 A1* | 11/2009 | Cooney et al. ................. 257/621 |
| 2009/0280643 A1* | 11/2009 | Andry et al. .................. 438/656 |
| 2010/0244247 A1* | 9/2010 | Chang et al. .................. 257/741 |
| 2011/0073997 A1* | 3/2011 | Leuschner et al. ............ 257/621 |

* cited by examiner

COST-EFFECTIVE TSV FORMATION

BACKGROUND

Through-substrate vias (TSVs) are commonly used in three-dimensional (3D) integrated circuits. TSVs penetrate through substrates, and are used to electrically inter-couple features on opposite sides of the substrates.

Conventionally, the TSV formation process includes etching or drilling into the substrate to form TSV openings. The TSV openings are then filled with a conductive material, which is then planarized to remove excess portions, and the remaining portions of the conductive material in the substrate form the TSVs. Additional metal lines and/or metal pads are then formed over and electrically coupled to the TSVs, for example, using damascene processes.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel through-substrate via (TSV) and the method of forming the same are provided in accordance with an embodiment. The intermediate stages of manufacturing an embodiment are illustrated. The variations of the embodiments are then discussed. Throughout the various views and illustrative embodiments, like reference numbers are used to designate like elements.

Figure 1:
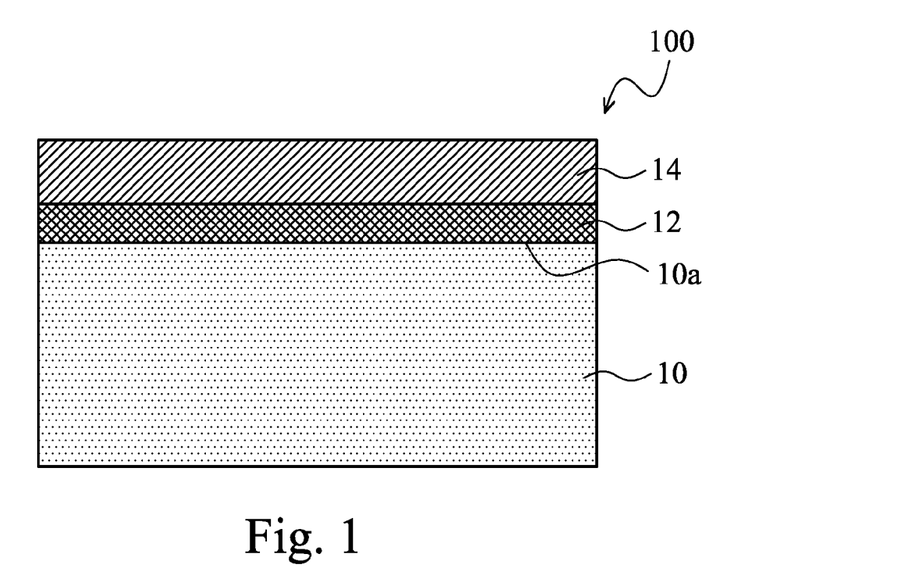
FIGS. 1 through 10 are cross-sectional views of intermediate stages in the manufacturing of a through-substrate via (TSV) in accordance with various embodiments.

Referring to FIG. 1, substrate 10 is provided. Substrate 10 may be a part of wafer 100. The illustrated structure is a portion of a chip/die in wafer 100, which includes a plurality of chips identical to the illustrated chip. Substrate 10 may be formed of a semiconductor material, such as silicon, silicon germanium, silicon carbide, gallium arsenide, or other commonly used semiconductor materials. Alternatively, substrate 10 is formed of a dielectric material such as silicon oxide. Wafer 100 may include active devices such as transistors (not shown). Accordingly, wafer 100 is a device wafer, and the respective chips/dies therein are device chips/dies. Alternatively, wafer 100 is free from active devices, and may include, or may be free from, passive devices such as capacitors, resistors, inductors, varactors, and/or the like (not shown). Accordingly, wafer 100 is an interposer wafer comprising interposers or a wafer comprising package substrates.

Dielectric layer 12 is formed over substrate 10. In an embodiment, substrate 10 is a semiconductor substrate, and dielectric layer 12 is an isolation layer, which may comprise an oxide formed through thermal oxidation of substrate 10. Alternatively, dielectric layer 12 may be formed using a deposition method, and may comprise silicon oxide, silicon nitride, or the like. In the embodiments in which the active devices (not shown) are formed at surface 10a of substrate 10, dielectric 12 may include an inter-layer dielectric (in which contact plugs (not shown) connected to the gate, source and drain regions of transistors are formed). Dielectric layer 12 may further include a contact etch stop layer (CESL, not shown). Dielectric layer 14 is formed on dielectric layer 12. The materials of dielectric layer 14 may include silicon oxide, a spin-on dielectric (SOD) material, polyimide, and/or the like. Alternatively, dielectric layer 14 is formed of a low-k dielectric material have a k value lower than about 3.0, or lower than about 2.5, for example. The thickness of dielectric layer 14 may be greater than the thickness of dielectric 12. Dielectric layers 12 and 14 may be formed of the same or different materials. Dielectric layer 14 may further include an etch stop layer (such as a silicon nitride layer or a silicon carbide layer, not shown) and/or a anti-reflection coating layer (ARC, such as a silicon oxynitride layer, not shown).

Figure 2:
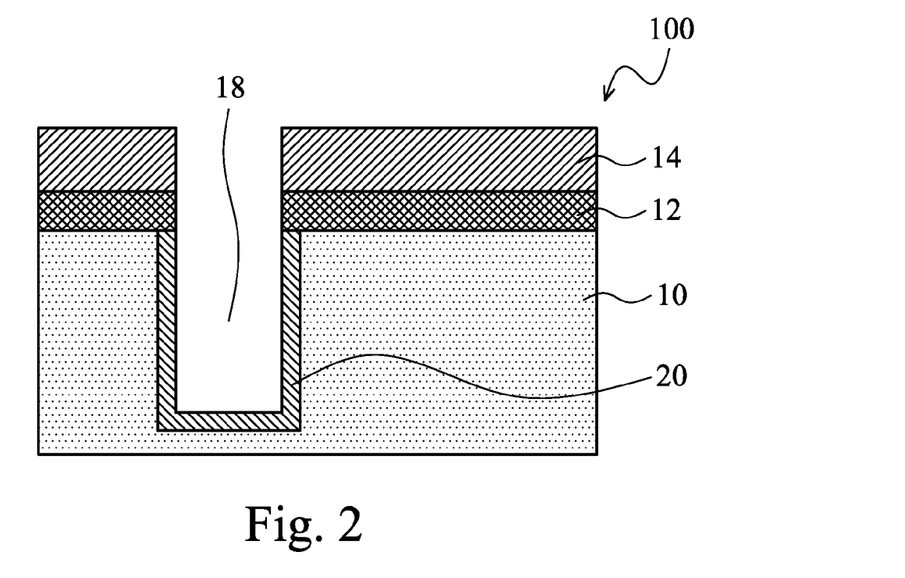

Referring to FIG. 2, TSV opening 18 is formed by etching into dielectric layers 14, 12, and into substrate 10. In the embodiments wherein substrate 10 is a semiconductor substrate, thermal oxide liner 20 may be formed on the surfaces of substrate 10, which surfaces are exposed to TSV opening 18. Thermal oxide liner 20 may be formed using thermal oxidation, although a deposition method such as plasma enhanced chemical vapor deposition (PECVD) may also be used.

Figure 3:
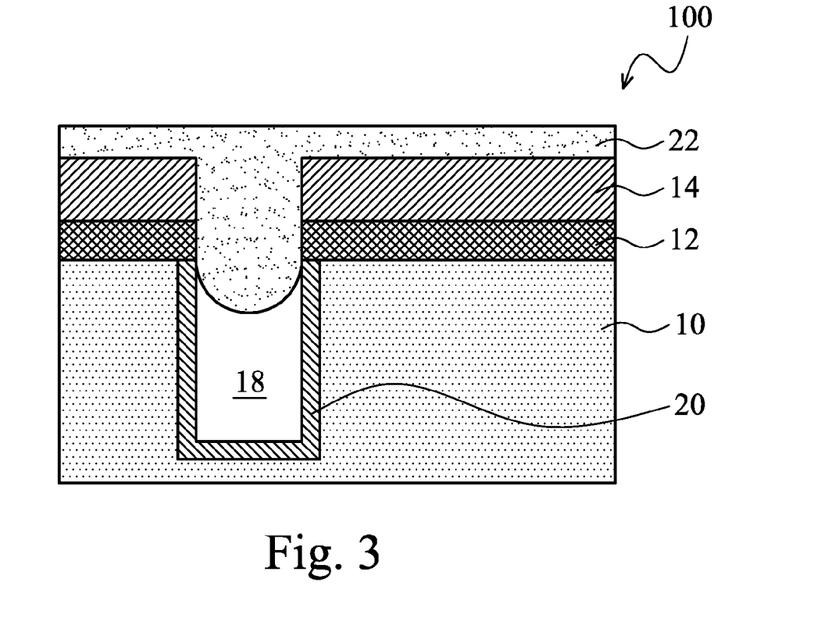
Figure 4:
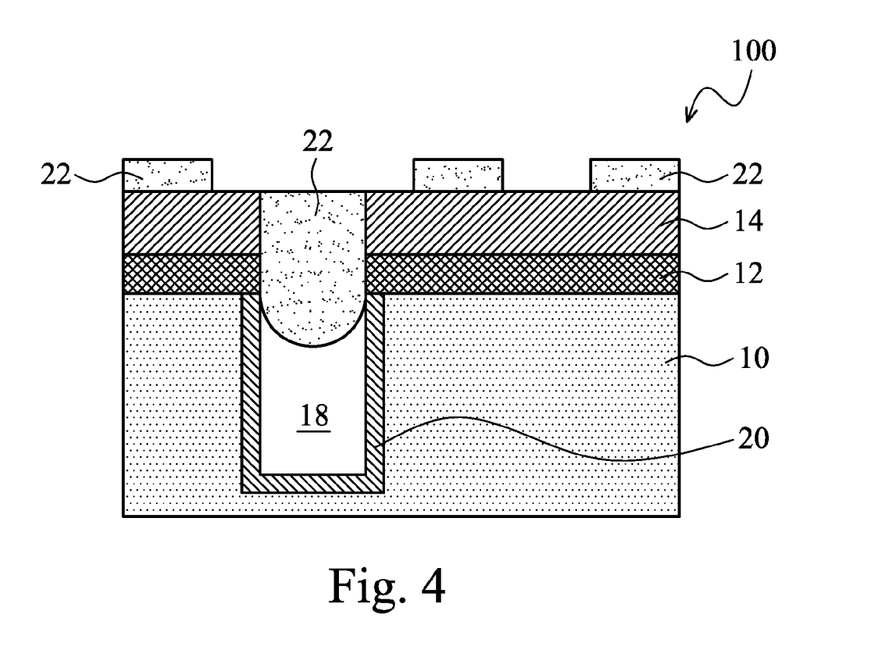

FIGS. 3 and 4 illustrate the application and the patterning of photo resist 22. Referring to FIG. 3, photo resist 22 is applied. Photo resist 22 may flow into TSV opening 18. In FIG. 4, photo resist 22 is exposed to light and developed, with the portion of photo resist 22 directly over TSV opening 18 being removed. Additional portions of photo resist 22 may be removed in order to form trench(es) in dielectric layer 14. It is observed that the lower portion of photo resist 22 in TSV opening 18 may not be exposed to light adequately, and hence is not removed during the development of photo resist 22.

Figure 5:
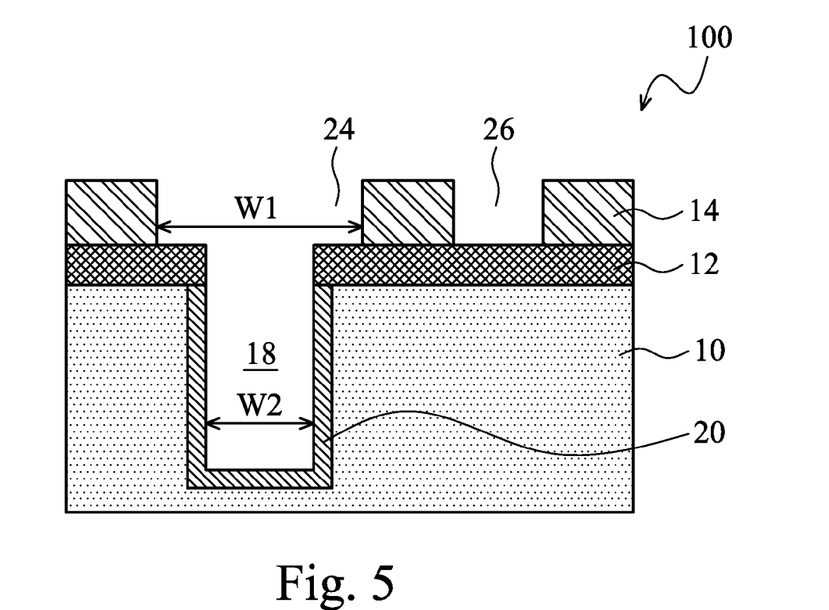

Next, as shown in FIG. 5, photo resist 22 is used as a mask to etch dielectric layer 14. During the etching step, dielectric layer 12 may be used as an etch stop layer, although an additional etch stop layer (not shown) may be formed between dielectric layers 12 and 14. As a result of the etching step, pad opening 24 and trench 26 are formed in dielectric layer 14. Photo resist 22 is then removed, for example, through an ashing step. The portion of photo resist 22 in TSV opening 18 is also removed. In the resulting structure, pad opening 24 may have horizontal dimension W1 (which may be a diameter or a length/width, depending on the top-view shape of pad opening 24) greater than horizontal dimension W2 of TSV opening 18.

Figure 6:
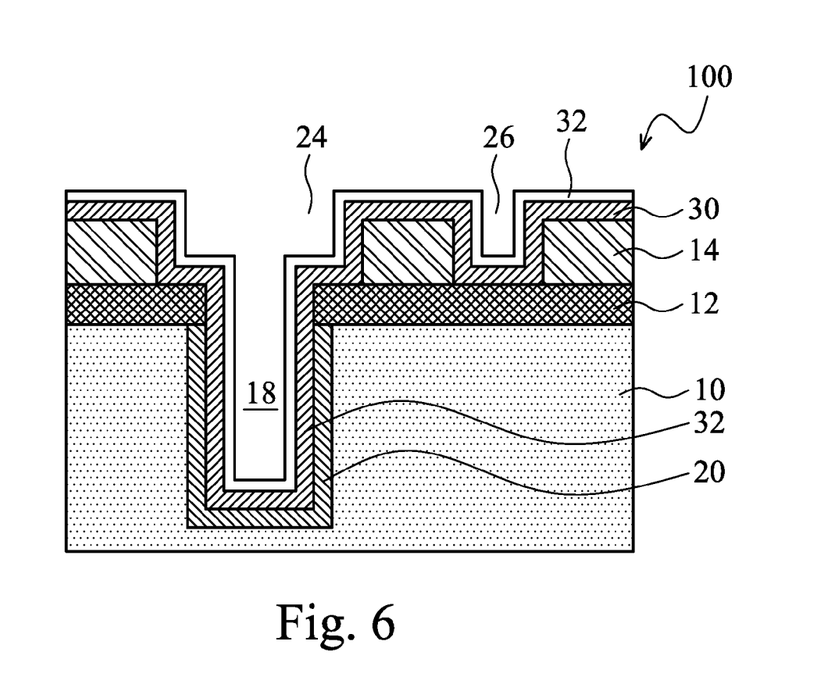

FIG. 6 illustrates the formation of barrier layer 30 and seed layer 32. In an embodiment, barrier layer 30 is formed of titanium, titanium nitride, tantalum, and/or tantalum nitride. Seed layer 32 may be formed of copper or a copper alloy. The applicable formation methods of barrier layer 30 and seed layer 32 include physical vapor deposition (PVD), chemical vapor deposition (CVD), and other deposition methods.

Figure 7:
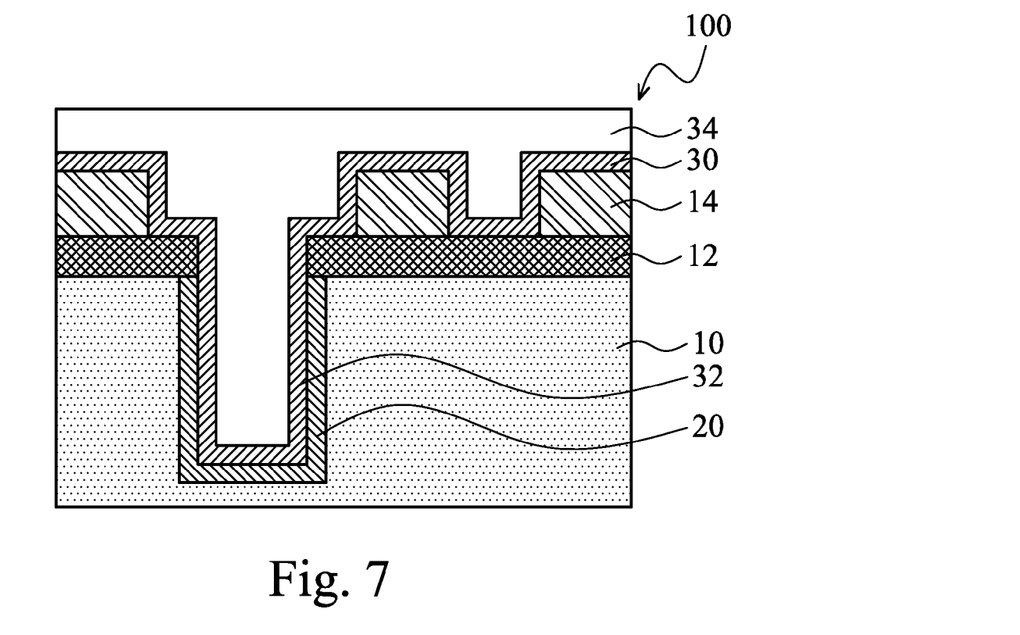
Figure 8:
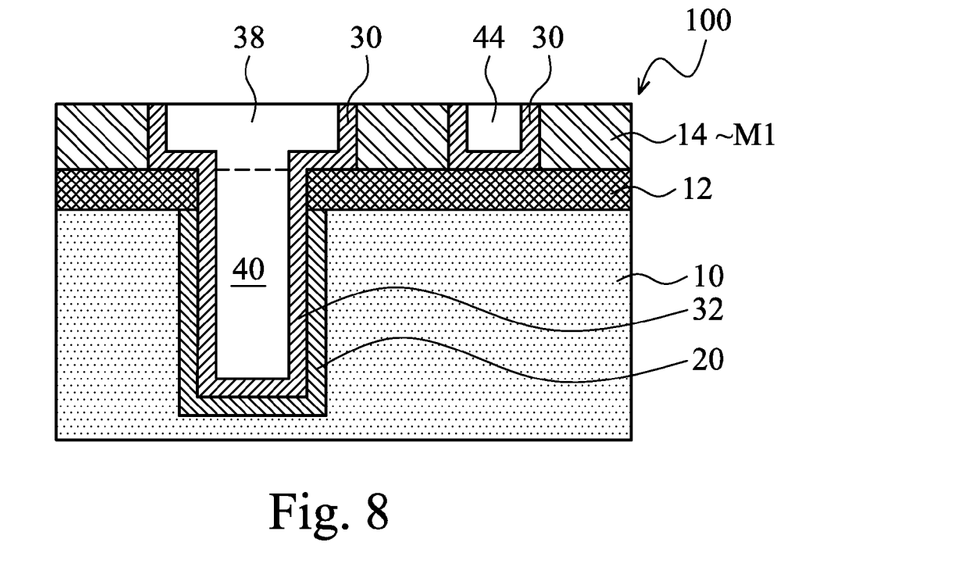

Metallic material 34 is then filled into openings 18, 24, and 26, for example using electro-chemical plating (ECP), as shown in FIG. 7. Seed layer 32 and metallic material 34 may be formed of similar materials such as copper, and hence seed layer 32 appears to be merged with metallic material 34, and is not shown in subsequent drawings. Metallic material 34 may comprise copper or copper alloys. The top surface of metallic material 34 is higher than the top surface of dielectric layer 14. Next, a chemical mechanical polish (CMP) is performed to remove excess portions of metallic material 34, which portions are above the top surface of dielectric layer 14. As a result, metal pad 38, metal line 44, and TSV 40 are formed. Throughout the description, metal pad 38 and metal line 44 are referred to as being located in metal layer M1, which is the first metal layer immediately over substrate 10. In subsequent steps, additional metal layer(s) and vias (not shown) may be formed over metal layer M1, and may be electrically coupled to metal pad 38, metal line 44, and TSV 40. Solder bumps (not shown) may also be formed over M1 and the additional metal layers, if any, to electrically couple to metal pad 38, metal line 44, and TSV 40.

Figure 9:
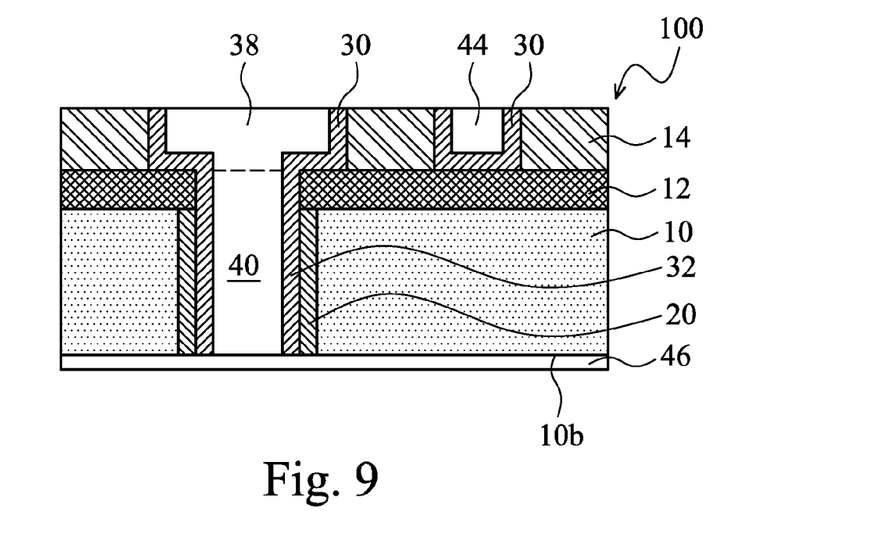
Figure 10:
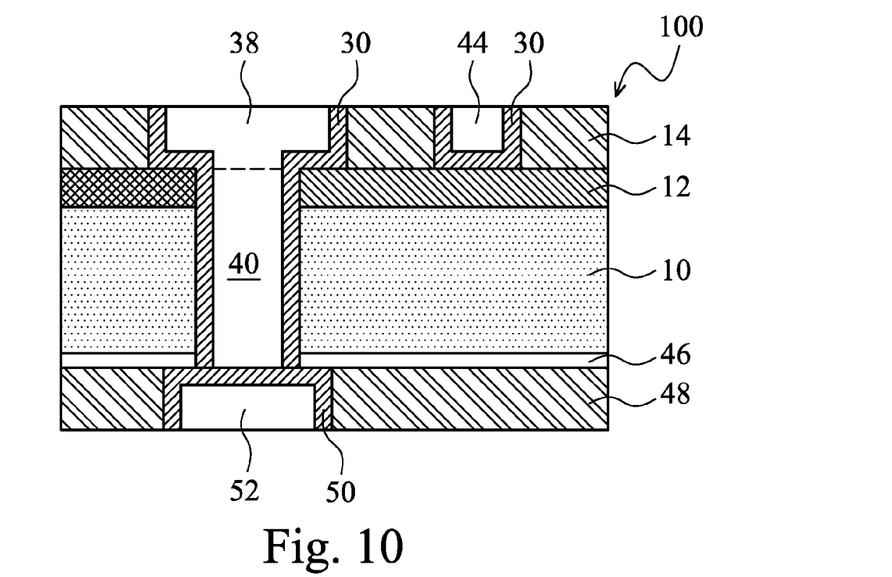

Next, as shown in FIG. 9, a grinding is performed on surface 10b of substrate 10, until TSV 40 is exposed. Isolation layer 46 is formed on surface 10b of the resulting substrate 10. Isolation layer 46 may be formed of silicon oxide, silicon nitride, or the like. Next, as shown in FIG. 10, dielectric layer 48 is formed on isolation layer 46. Dielectric layer 48 may comprise similar materials as dielectric layer 14. Diffusion barrier layer 50 and metal pad 52 are then formed in dielectric layer 48, and are electrically coupled to TSV 40. Similarly, diffusion barrier layer 50 may be formed of titanium, titanium nitride, tantalum, and/or tantalum nitride, while metal pad 52 may be formed of a copper-containing material. The formation process of diffusion barrier layer 50 and metal pad 52 may include forming a pad opening (not shown, occupied by diffusion barrier layer 50 and metal pad 52) in dielectric layer 48, forming a diffusion barrier layer and a seed layer, performing an ECP to fill the opening with a metallic material, and then performing a CMP to remove excess metallic material. Additional metal layers and bumps (not shown) may also be formed on the same side of substrate 10 as metal pad 52, and electrically coupled to TSV 40.

In the structure as shown in FIG. 10, it is observed that metal pad 38 and TSV 40 do not have a diffusion barrier layer therebetween. Instead, the respective diffusion barrier layer 30 continuously extends from the top surface of dielectric layer 14 into substrate 10. In other words, metal pad 38 and TSV 40 are formed of a same material, which continuously extend from the top surface of dielectric layer 14 to the bottom surface of substrate 10, with no diffusion barrier layer (which is formed of a material different from that of metal pad 38 and TSV 40) between and separating metal pad 38 and TSV 40. On the other hand, TSV 40 and metal pad 52 are spaced apart from each other by diffusion barrier layer 50, which is formed of a material different from the material of TSV 40 and metal pad 52. Further, metal pad 38 may be formed either on the front side or the backside of substrate 10. In the embodiments wherein active devices (not shown) are formed in wafer 100, the resulting chip/die sawed from wafer 100 may be a device die. Alternatively, the embodiments wherein no active devices (not shown) are formed in wafer 100, the resulting chip/die sawed from wafer 100 may be an interposer die or a package substrate.

In above-discussed embodiments, isolation layer 46, dielectric layer 48, diffusion barrier layer 50, and metal pad 52 are formed after the formation of TSV 40. In alternative embodiments, isolation layer 46, dielectric layer 48, diffusion barrier layer 50 and metal pad 52 may be formed before the formation of TSV 40. Accordingly, in the formation of the TSV opening (refer to 18 in FIG. 2), diffusion barrier layer 50 and metal pad 52 may be used as an etch stop layer for etching substrate 10.

Figure 11:
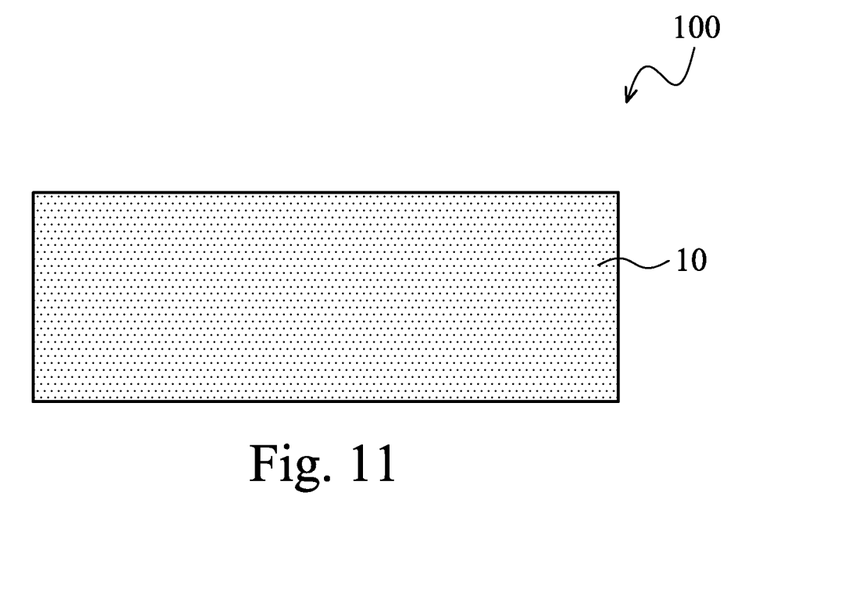
FIGS. 11 through 16 are cross-sectional views of intermediate stages in the manufacturing of a TSV in accordance with alternative embodiments.
Figure 12:
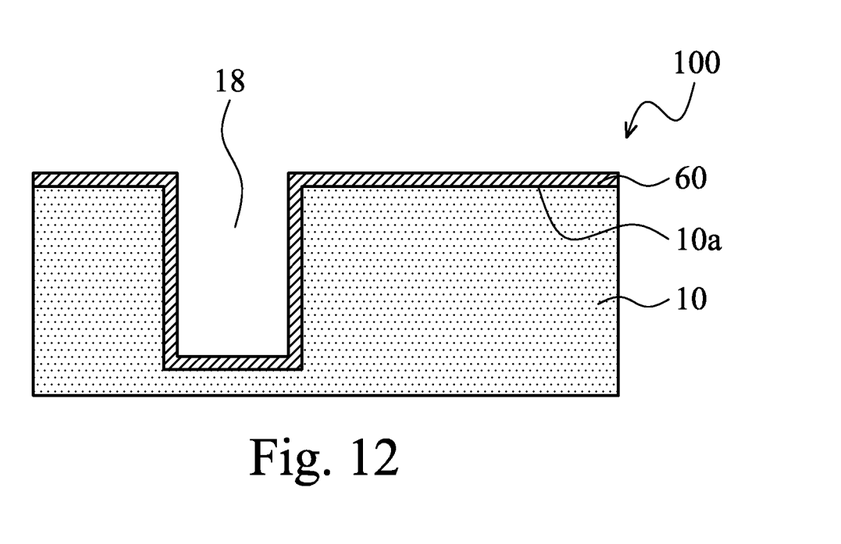

FIGS. 11 through 16 illustrate cross-sectional views of intermediate stages in the formation of a TSV in accordance with alternative embodiments. Unless specified otherwise, the reference numerals in these embodiments represent like elements as in the embodiments illustrated in FIGS. 1 through 10. The materials and the formation details of these elements hence may not be repeated herein. Referring to FIG. 11, substrate 10 is provided. Substrate 10 is formed of a semiconductor material such as silicon. In FIG. 12, TSV opening 18 is formed, for example, by etching into substrate 10. Dielectric liner 60 is formed on the sidewalls and the bottom of TSV opening 18. In an embodiment, dielectric liner 60 is formed of thermal oxidation, and hence may comprise silicon oxide, for example. In alternative embodiments, dielectric liner 60 may be deposited using a deposition method suitable for forming conformal dielectric layers, and may comprise silicon oxide, silicon nitride, silicon oxynitride, and/or other commonly used dielectric materials. Dielectric liner 60 thus includes portions inside TSV opening, and portions directly over, and contacting, the top surface 10a of substrate 10.

Figure 13:
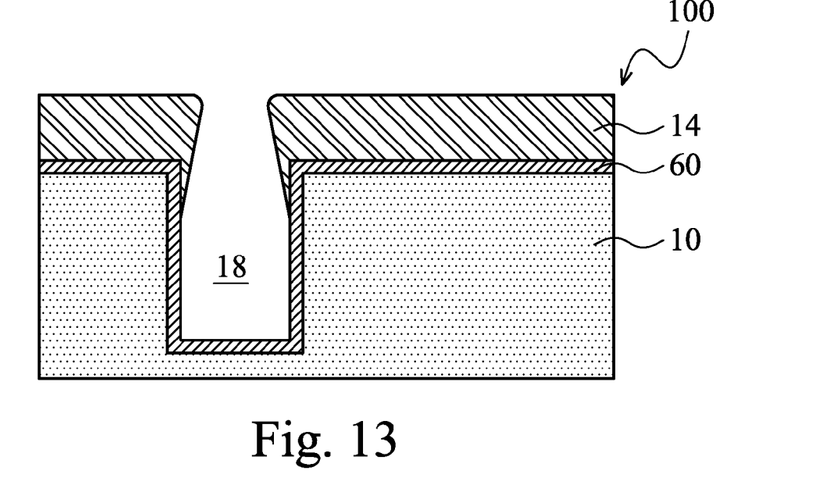
Figure 14:
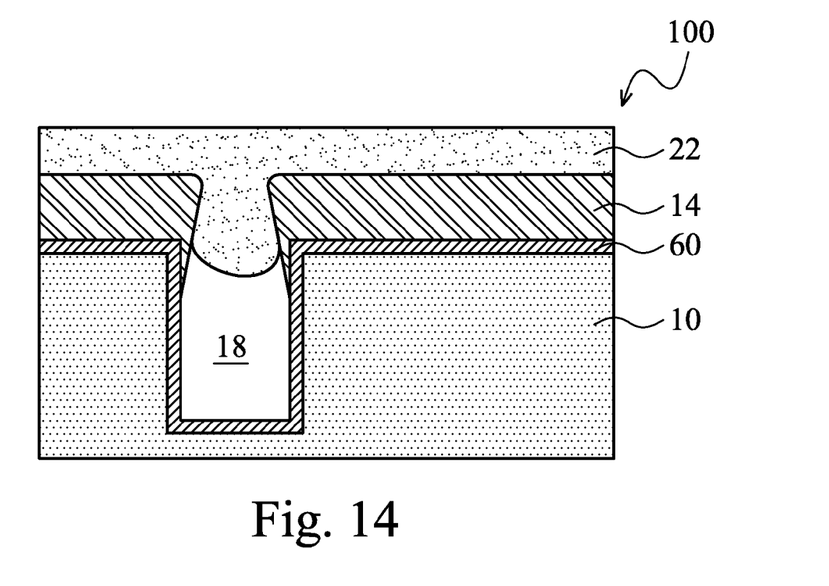
Figure 15:
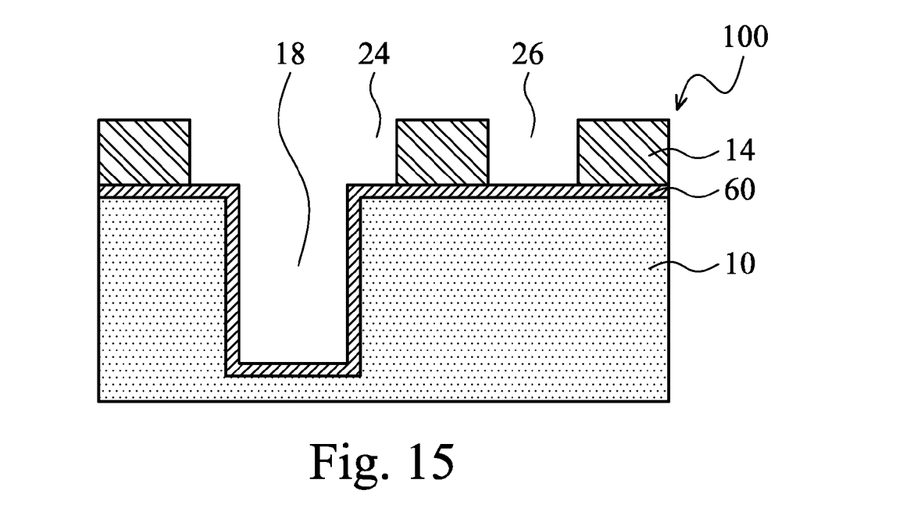
Figure 16:
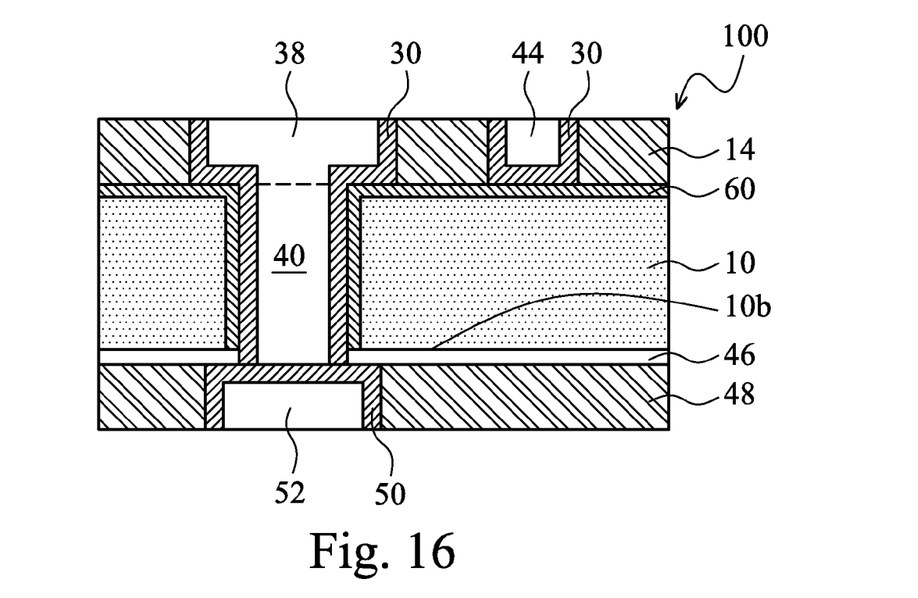

Next, referring to FIG. 13, dielectric layer 14 is formed over dielectric liner 60, for example, using a deposition method suitable for forming non-conformal dielectric layers. An exemplary deposition method is CVD, for example. Similarly, dielectric layer 14 may further include an etch stop layer (such as a silicon nitride layer or a silicon carbide layer, not shown) and/or an anti-reflection coating layer (ARC, such as a silicon oxynitride layer, not shown). As a result, less dielectric material is disposed inside TSV opening 18. Next, photo resist 22 is formed over dielectric layer 14, as shown in FIG. 14, and is then patterned to form pad opening 24 and trench 26 in dielectric layer 14. The resulting structure is shown in FIG. 15. Photo resist 22 is then removed. The remaining processes are essentially the same as shown in FIGS. 6 through 10, and hence are not discussed in detail herein. FIG. 16 illustrates a resulting structure after the like process steps as shown in FIGS. 6 through 10 are performed, which structure includes metal pads 38 and 52, TSV 40, and metal line 44. Similar to the embodiment as shown in FIG. 10, metal pad 38 and TSV 40 do not have a diffusion barrier layer therebetween, while one of diffusion barrier layers 30 continuously extends from the top surface of dielectric layer 14 to surface 10b of substrate 10.

In accordance with embodiments, a device includes a substrate having a first surface, and a second surface opposite the first surface. A TSV extends from the first surface to the second surface of the substrate. A dielectric layer is disposed over the substrate. A metal pad is disposed in the dielectric layer and physically contacting the TSV, wherein the metal pad and the TSV are formed of a same material, and wherein no layer formed of a material different from the same material is between and spacing the TSV and the metal pad apart from each other.

In accordance with other embodiments, a device includes a substrate having a top surface, and a bottom surface opposite the top surface; a TSV extending from the top surface of the substrate into the substrate; an isolation layer over the top surface of the substrate; a dielectric layer over the isolation layer; a metal pad in the dielectric layer and contacting the TSV, wherein the metal pad and the TSV are formed of a same material, and have different horizontal dimensions; and a conductive diffusion barrier extending from a top surface of the dielectric layer to the bottom surface of the TSV, wherein the conductive diffusion barrier encircles the metal pad and the TSV.

In accordance with yet other embodiments, a device includes a semiconductor substrate having a top surface, and a bottom surface opposite the top surface; a TSV extending from the top surface to the bottom surface of substrate; a first dielectric layer over the semiconductor substrate; a second dielectric layer over the first dielectric layer; and a metal pad in the second dielectric layer and electrically coupled to the TSV. The metal pad and the TSV are formed of a same copper-containing material, wherein the metal pad has a horizontal dimension greater than a horizontal dimension of the TSV. The device further includes a diffusion barrier comprising a first sidewall portion on a sidewall of the metal pad; and a second sidewall portion on a sidewall of the TSV, wherein the diffusion barrier does not comprise any portion extending between the metal pad and the TSV.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   providing a substrate having a major surface;
   forming a dielectric layer over the major surface;
   forming a first opening in the substrate;
   forming a second opening in the dielectric layer, wherein the first and the second openings are aligned along a common axis orthogonal to the major surface and have different horizontal dimensions;
   after the step of forming the first opening and before the step of forming the second opening, forming a dielectric liner on surfaces of the substrate exposed to the first opening;
   filling the first and the second openings with a metallic material, wherein the metallic material is continuous; and
   performing a planarization on the metallic material to remove excess portions of the metallic material above a top surface of the dielectric layer, wherein remaining portions of the metallic material form a through-substrate via (TSV) in the first opening, and a first metal pad in the second opening.

2. The method of claim 1 further comprising, before the step of filling the metallic material, forming a diffusion barrier on sidewalls of the first and the second openings.

3. The method of claim 1 further comprising, before the step of forming the dielectric layer, forming an isolation layer over and contacting a top surface of the substrate.

4. The method of claim 1, wherein the step of forming the dielectric layer is performed after the step of forming the first opening, and wherein the method further comprises, after the step of forming the first opening and before the step of forming the dielectric layer, forming a dielectric liner on sidewalls of the first opening and on a top surface of the substrate.

5. The method of claim 1 further comprising, after the step of performing the planarization:

grinding the substrate until the TSV is exposed;
forming a diffusion barrier layer contacting the TSV; and
forming a second metal pad contacting the diffusion barrier layer and electrically coupled to the TSV.

6. The method of claim 1 further comprising:
   at a time the step of forming the second opening is performed, simultaneously forming a trench in the dielectric layer, wherein the metallic material is filled into the trench, and wherein after the step of performing the planarization on the metallic material, a metal line is formed in the trench.

7. The method of claim 1, wherein the substrate is a semiconductor substrate, and wherein the first metal pad is in a first metal layer, the first metal layer being immediately over an inter-layer dielectric.

8. The method of claim 1, wherein the substrate is a semiconductor substrate, and wherein no active device is formed on any surface of the substrate.

9. The method of claim 1, wherein the substrate is a dielectric substrate.

10. A method comprising:
    providing a substrate;
    forming an isolation layer over the substrate;
    forming a first dielectric layer over the isolation layer;
    forming a first opening extending from a top surface of the first dielectric layer into the substrate;
    partially filling the first opening with a sacrificial material;
    after the partially filling the first opening, etching the first dielectric layer to expand the first opening in the first dielectric layer into a second opening;
    forming a first diffusion barrier layer on sidewalls of the first and the second openings;
    completely filling a remainder of the first and the second openings with a metallic material over the first diffusion barrier layer; and
    performing a planarization on the metallic material to remove excess portions of the metallic material above a top surface of the first dielectric layer to form a through-substrate via (TSV) in the first opening, and a first metal pad in the second opening.

11. The method of claim 10 further comprising, before the step of forming the first dielectric layer, performing a thermal oxidation to form an oxide liner in the first opening.

12. The method of claim 10, wherein the TSV extends into an intermediate level of the substrate, and wherein the method further comprises, after the step of performing the planarization:
    grinding the substrate until the TSV is exposed;
    forming a second diffusion barrier layer contacting the TSV; and
    forming a second metal pad contacting the second diffusion barrier layer and electrically coupled to the TSV.

13. The method of claim 10 further comprising:
    before the step of forming the first opening, forming a second dielectric layer, wherein the first and the second dielectric layers are on opposite sides of the substrate;
    forming a second diffusion barrier layer in the second dielectric layer; and
    forming a second metal pad in the second dielectric layer and contacting the second diffusion barrier layer, wherein during the step of forming the first opening, the second diffusion barrier layer is used as an etch stop layer.

14. The method of claim 10 further comprising:
    at a time the step of etching the dielectric layer to expand the first opening is performed, simultaneously forming a trench in the dielectric layer, wherein the metallic material is filled into the trench in the step of filling the metallic material, and wherein after the step of performing the planarization, a metal line is formed in the trench.

15. The method of claim 10, wherein the substrate is a semiconductor substrate, and wherein the first metal pad is in a first metal layer, the first metal layer being immediately over an inter-layer dielectric.

16. The method of claim 10, wherein the substrate is a semiconductor substrate, and wherein no active device is formed on any surface of the substrate.

17. The method of claim 10, wherein the substrate is a dielectric substrate.

18. The method of claim 10 wherein the sacrificial material is a first portion of a photoresist material and wherein a second portion of the photoresist material is used as a mask during the step forming the second opening in the dielectric layer.

* * * * *